(12) United States Patent
Wakabayashi et al.

(10) Patent No.: US 11,866,842 B2
(45) Date of Patent: Jan. 9, 2024

(54) SHORT CIRCUIT DETECTION METHOD IN PLATING APPARATUS, CONTROL METHOD OF PLATING APPARATUS, AND PLATING APPARATUS

(71) Applicant: EBARA CORPORATION, Tokyo (JP)

(72) Inventors: Hideki Wakabayashi, Tokyo (JP); Tensei Sato, Tokyo (JP); Kazuma Ideguchi, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 0 days.

(21) Appl. No.: 17/548,060

(22) Filed: Dec. 10, 2021

(65) Prior Publication Data

US 2022/0228286 A1    Jul. 21, 2022

(30) Foreign Application Priority Data

Jan. 20, 2021    (JP) .................................. 2021-007274

(51) Int. Cl.
  *C25D 21/12*    (2006.01)
  *G01R 31/52*    (2020.01)
  *C25D 17/00*    (2006.01)

(52) U.S. Cl.
  CPC ........... *C25D 21/12* (2013.01); *C25D 17/005* (2013.01); *G01R 31/52* (2020.01)

(58) Field of Classification Search
  None
  See application file for complete search history.

(56) References Cited

U.S. PATENT DOCUMENTS

| 4,452,680 A * | 6/1984 | Jackson ................. C25D 21/12 205/82 |
| 2006/0113185 A1* | 6/2006 | Kuriyama ............ C25D 17/008 257/E21.174 |

FOREIGN PATENT DOCUMENTS

| JP | 58154322 A | * | 9/1983 |
| JP | 63-095812 A |   | 4/1988 |

* cited by examiner

*Primary Examiner* — Louis J Rufo
(74) *Attorney, Agent, or Firm* — BakerHostetler

(57) ABSTRACT

In a plating apparatus, a short circuit of a wiring between a rectifier and a plating device is detected without using a substrate in vain. In the plating apparatus that supplies a current from the rectifier to the substrate to plate the substrate, a short circuit detection method includes a step of outputting a current with a predetermined current value from the rectifier, in a state where the substrate and a substrate holder holding the substrate are not electrically connected to the rectifier, a step of acquiring an output voltage value of the rectifier, a step of comparing the output voltage value with a predetermined reference voltage value, and a step of determining that a short circuit occurs in a circuit for connecting the rectifier and the substrate, in a case where the output voltage value is lower than the reference voltage value.

3 Claims, 6 Drawing Sheets

SHORT CIRCUIT DETECTION METHOD IN PLATING APPARATUS, CONTROL METHOD OF PLATING APPARATUS, AND PLATING APPARATUS

TECHNICAL FIELD

The present invention relates to a short circuit detection method in a plating apparatus, a control method of a plating apparatus, and a plating apparatus.

BACKGROUND ART

In a plating apparatus, a wiring might be short-circuited, for example, due to a chemical solution sticking to the wiring connecting a plating device and a rectifier. In this case, a current cannot flow from the rectifier to a substrate disposed in the plating device, and a problem occurs that the substrate cannot be plated. As a short circuit detection method in the rectifier, for example, such a method as disclosed in PTL 1 is known.

CITATION LIST

Patent Literature

PTL 1: Japanese Patent Laid-Open No. 63-95812

SUMMARY OF INVENTION

Technical Problem

Heretofore, in a plating apparatus, a short circuit has been detected in a state where a substrate is immersed into a plating solution in a plating device. Therefore, it is necessary to discard, as a defective product, the substrate used when detecting the short circuit, and the substrate is wasted.

One of objects of the present invention, which has been made in view of the above respects, is to detect a short circuit of a wiring between a rectifier and a plating device in a plating apparatus, without using a substrate in vain.

Solution to Problem

To solve the aforementioned problems, an aspect of the present invention is a short circuit detection method in a plating apparatus that supplies a current from a rectifier to a substrate to plate the substrate, the short circuit detection method comprising a step of outputting a current with a predetermined current value from the rectifier, in a state where the substrate and a substrate holder holding the substrate are not electrically connected to the rectifier, a step of acquiring an output voltage value of the rectifier, a step of comparing the output voltage value with a predetermined reference voltage value, and a step of determining that a short circuit occurs in a circuit for connecting the rectifier and the substrate, in a case where the output voltage value is lower than the reference voltage value.

Further, another aspect of the present invention is the short circuit detection method in the above aspect further comprising a step of determining that the short circuit does not occur in the circuit for connecting the rectifier and the substrate, in a case where the output voltage value is higher than the reference voltage value.

Further, another aspect of the present invention is the short circuit detection method in the above aspect, wherein each of the steps is performed before the plating of the substrate is started.

Further, another aspect of the present invention is the short circuit detection method in the above aspect, wherein the current with the predetermined current value is a current smaller than the current to be outputted from the rectifier during plating processing of the substrate.

Further, another aspect of the present invention is a control method of a plating apparatus that supplies a current from a rectifier to a substrate to plate the substrate, the control method of the plating apparatus comprising a step of outputting, from the rectifier, a current with a current value smaller than that during plating processing, in a state where the substrate and a substrate holder holding the substrate are not electrically connected to the rectifier, a step of acquiring an output voltage value of the rectifier, a step of comparing the output voltage value with a predetermined reference voltage value, a step of determining that a short circuit does not occur in a circuit for connecting the rectifier and the substrate, in a case where the output voltage value is higher than the reference voltage value, a step of determining that the short circuit occurs in the circuit for connecting the rectifier and the substrate, in a case where the output voltage value is lower than the reference voltage value, a step of electrically connecting the substrate and the substrate holder holding the substrate to the rectifier, and performing the plating processing of the substrate, in response to the determination that the short circuit does not occur in the circuit for connecting the rectifier and the substrate, and a step of prohibiting the plating processing of the substrate, in response to the determination that the short circuit occurs in the circuit for connecting the rectifier and the substrate.

Further, another further aspect of the present invention is a plating apparatus comprising a plating device for plating a substrate, a rectifier for supplying a current to the substrate, and a control unit, the control unit being configured to output a current with a predetermined current value from the rectifier, in a state where the substrate and a substrate holder holding the substrate are not electrically connected to the rectifier, acquire an output voltage value of the rectifier, compare the output voltage value with a predetermined reference voltage value, and determine that a short circuit occurs in a circuit for connecting the rectifier and the substrate, in a case where the output voltage value is lower than the reference voltage value.

DESCRIPTION OF EMBODIMENT

Figure 1:
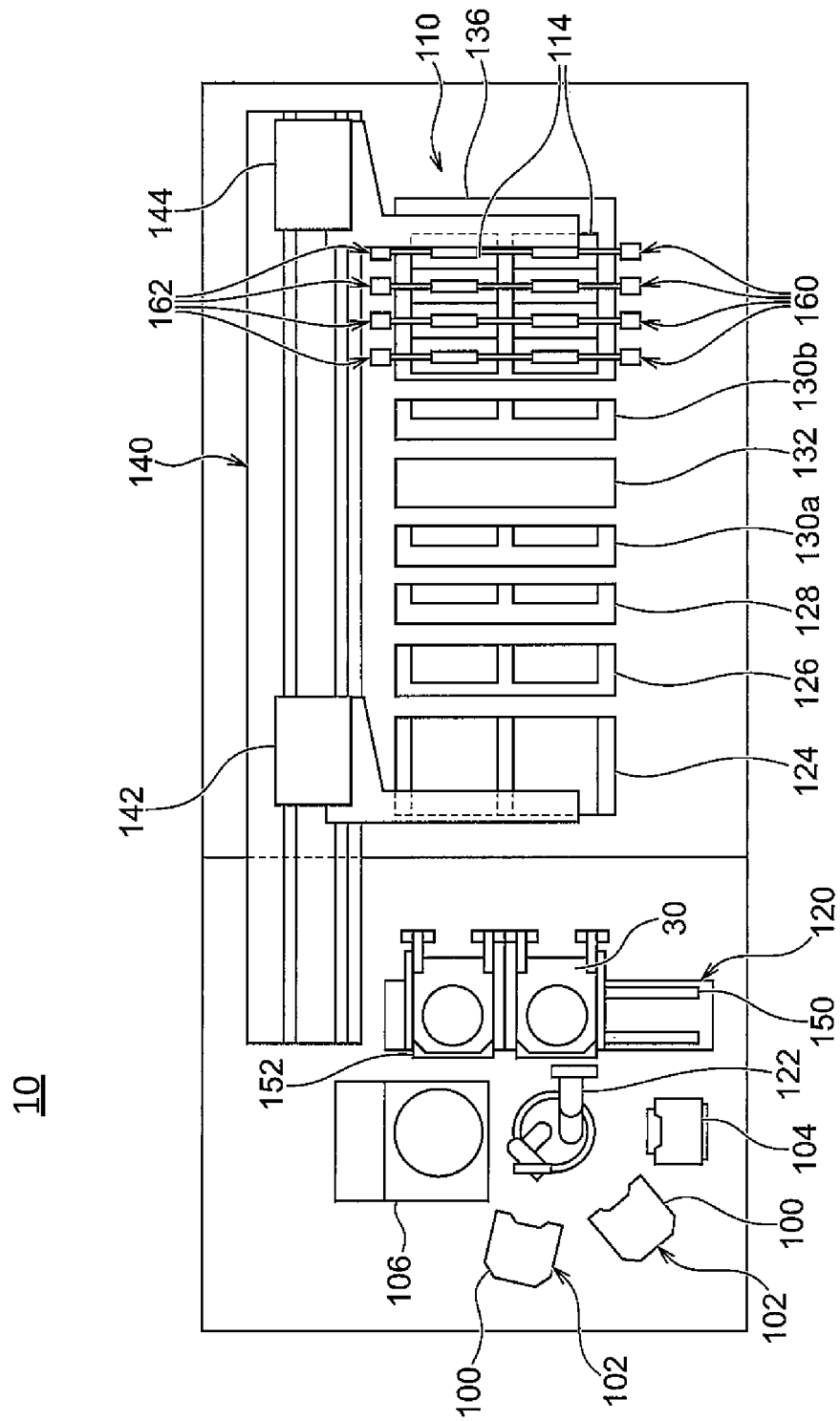
FIG. 1 is an overall layout of a plating apparatus to which a method according to an embodiment of the present invention can be applied.

Hereinafter, description will be made as to an embodiment of the present invention with reference to the drawings. In the drawings described below, the same or corresponding constituent elements are denoted with the same reference sign and redundant description is not repeated.

FIG. 1 is an overall layout of a plating apparatus 10 to which a method according to an embodiment of the present invention can be applied.

As shown in FIG. 1, the plating apparatus 10 includes two cassette tables 102, an aligner 104 that aligns a position of an orientation flat, a notch or the like of a substrate in a predetermined direction, and a spin rinse dryer 106 that dries the plated substrate by rotating the substrate at high speed. On each cassette table 102, a cassette 100 containing the substrate such as a semiconductor wafer is mounted. Near the spin rinse dryer 106, a load/unload station 120 including a substrate holder 30 mounted thereon is disposed to attach and remove the substrate. In a center of these units 100, 104, 106 and 120, a transfer robot 122 is disposed to transfer the substrate to and from these units.

The load/unload station 120 includes a flat plate-shaped mounting plate 152 that is slidable in a lateral direction along a rail 150. Two substrate holders 30 are horizontally mounted in parallel on the mounting plate 152. The substrate is delivered between one of the substrate holders 30 and the transfer robot 122, the mounting plate 152 is then laterally slid, and the substrate is delivered between the other substrate holder 30 and the transfer robot 122.

The plating apparatus 10 further includes a stocker 124, a pre-wet module 126, a pre-soak module 128, a first rinse module 130a, a blow module 132, a second rinse module 130b, and a plating module 110. In the stocker 124, the substrate holder 30 is stocked and temporarily stored. In the pre-wet module 126, the substrate is immersed into pure water. In the pre-soak module 128, an oxide film on the surface of a conductive layer such as a seed layer formed on the surface of the substrate is removed by etching. In the first rinse module 130a, the pre-soaked substrate is cleaned together with the substrate holder 30 with a cleaning solution (pure water or the like). In the blow module 132, the cleaned substrate is drained. In the second rinse module 130b, the plated substrate is cleaned together with the substrate holder 30 with the cleaning solution. The load/unload station 120, the stocker 124, the pre-wet module 126, the pre-soak module 128, the first rinse module 130a, the blow module 132, the second rinse module 130b and the plating module 110 are arranged in this order.

The plating module 110 is configured, for example, by housing a plurality of plating devices 114 in an overflow tank 136. In an example of FIG. 1, the plating module 110 includes eight plating devices 114. Each plating device 114 stores one substrate therein, and is configured to immerse the substrate into a plating solution held therein and plate the surface of the substrate with copper or the like.

The plating apparatus 10 includes a transfer device 140 in which, for example, a linear motor system is adopted, the transfer device being located on a side of the devices, to transfer the substrate holder 30 together with the substrate among these devices. The transfer device 140 includes a first transfer device 142 and a second transfer device 144. The first transfer device 142 is configured to transfer the substrate to and from the load/unload station 120, the stocker 124, the pre-wet module 126, the pre-soak module 128, the first rinse module 130a, and the blow module 132. The second transfer device 144 is configured to transfer the substrate to and from the first rinse module 130a, the second rinse module 130b, the blow module 132, and the plating module 110. The plating apparatus 10 does not have to include the second transfer device 144, and may only include the first transfer device 142.

On opposite sides of the overflow tank 136, paddle drive parts 160 and paddle driven parts 162 are arranged to drive paddles that are stirring rods located in the respective plating devices 114, to stir the plating solution in the plating devices 114.

An example of a series of plating processing by the plating apparatus 10 will be described. First, one substrate is taken out from the cassette 100 mounted on each cassette table 102 with the transfer robot 122, to transfer the substrate to the aligner 104. The aligner 104 aligns the position of the orientation flat, the notch or the like in the predetermined direction. The substrate oriented with the aligner 104 is transferred to the load/unload station 120 by the transfer robot 122.

In the load/unload station 120, two substrate holders 30 stocked in the stocker 124 are simultaneously grasped with the first transfer device 142 of the transfer device 140, and are transferred to the load/unload station 120. Then, the two substrate holders 30 are simultaneously horizontally mounted on the mounting plate 152 of the load/unload station 120. In this state, the substrate is transferred to each substrate holder 30 by the transfer robot 122, and the transferred substrate is held by the substrate holder 30.

Next, the two substrate holders 30 holding the substrates are simultaneously grasped with the first transfer device 142 of the transfer device 140, and are stored in the pre-wet module 126. Next, each substrate holder 30 holding the substrate processed in the pre-wet module 126 is transferred to the pre-soak module 128 by the first transfer device 142, and the oxide film on the substrate is etched with the pre-soak module 128. Subsequently, the substrate holder 30 holding the substrate is transferred to the first rinse module 130a, to wash the surface of the substrate with pure water stored in the first rinse module 130a.

The substrate holder 30 holding the substrate washed with water is transferred from the first rinse module 130a to the plating module 110 by the second transfer device 144, and is stored in each plating device 114 filled with the plating solution. The second transfer device 144 sequentially repeats the above procedure, to sequentially store the substrate holders 30 holding the substrates in the respective plating devices 114 of the plating module 110.

In each plating device 114, a plating voltage is applied across an anode (not shown) and the substrate in the plating device 114, and the paddle is reciprocally moved in parallel with the surface of the substrate simultaneously by each paddle drive part 160 and each paddle driven part 162, to plate the surface of the substrate.

After the plating ends, two substrate holders 30 holding the plated substrates are simultaneously grasped with the second transfer device 144, transferred to the second rinse module 130b, and immersed into pure water stored in the second rinse module 130b to clean the surfaces of the substrates with pure water. Next, the substrate holders 30 are transferred to the blow module 132 by the second transfer device 144, and water drops adhered to the substrate holders 30 are removed by blowing air or the like. Afterward, the substrate holders 30 are transferred to the load/unload station 120 by the first transfer device 142.

In the load/unload station 120, the transfer robot 122 takes out each processed substrate from the substrate holder 30, and transfers the substrate to the spin rinse dryer 106. The spin rinse dryer 106 rotates at high speed to rotate the plated substrate at high speed and dry the substrate. The transfer robot 122 returns the dried substrate to the cassette 100.

Figure 2:
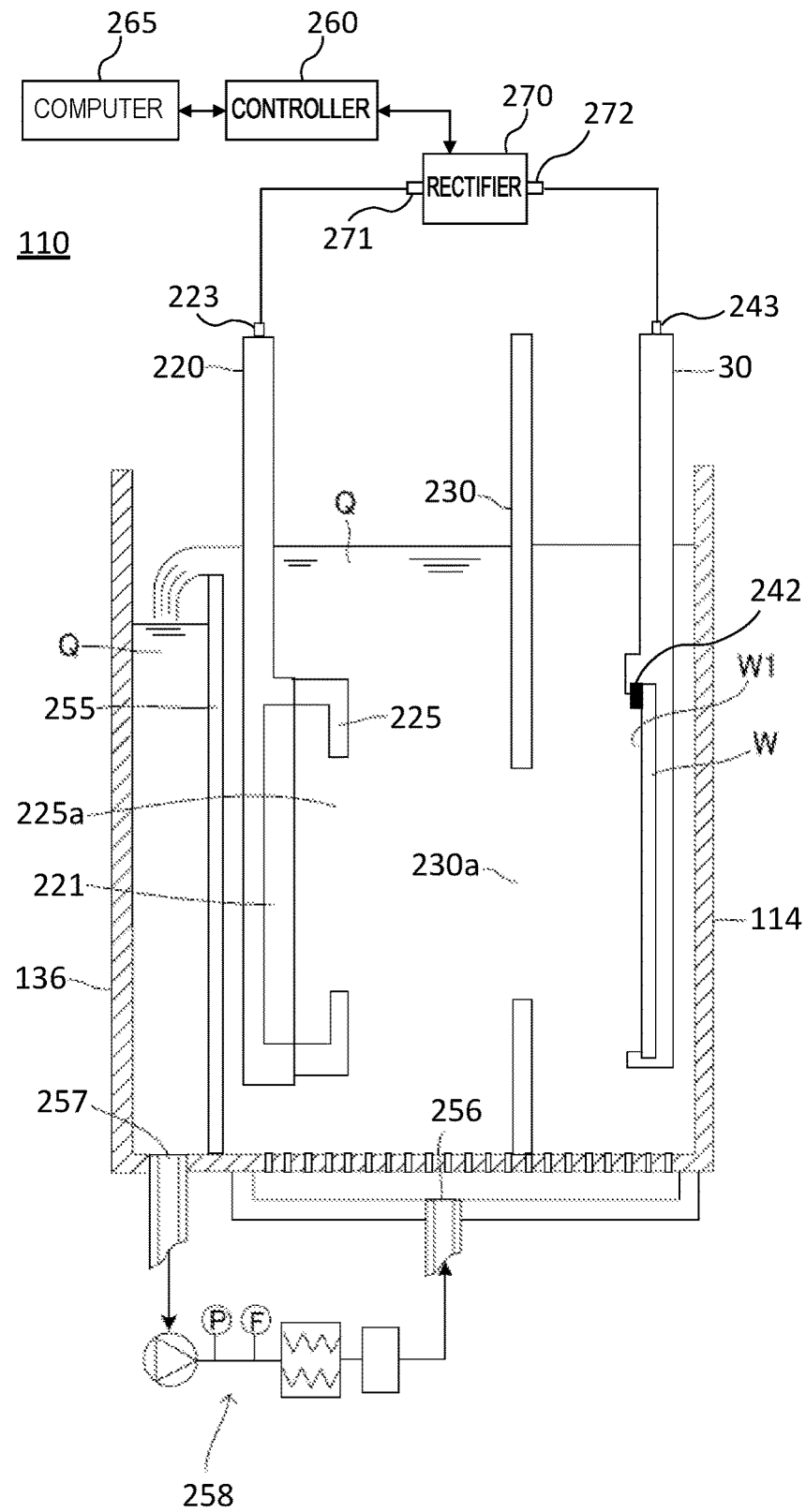
FIG. 2 is a schematic side cross-sectional view of a plating module included in the plating apparatus.

FIG. 2 is a schematic side cross-sectional view of the plating module 110 described above. As shown in the drawing, the plating module 110 includes an anode holder 220 configured to hold an anode 221, the substrate holder 30 configured to hold a substrate W, the plating device 114 that stores a plating solution Q containing an additive, and the overflow tank 136 that receives the plating solution Q overflowed from the plating device 114 to discharge the solution. The plating device 114 and the overflow tank 136 are separated by a partition wall 255. The anode holder 220 and the substrate holder 30 are stored in the plating device 114. As described above, the substrate holder 30 holding the substrate W is transferred by the second transfer device 144 (see FIG. 1) and stored in the plating device 114.

Note that FIG. 2 shows only one plating device 114, but the plating module 110 may include a plurality of plating devices 114 having the same configuration as in FIG. 2 as described above.

The anode 221 is electrically connected to a positive terminal 271 of a rectifier 270 via an electric terminal 223 disposed in the anode holder 220. The substrate W is electrically connected to a negative terminal 272 of the rectifier 270 via an electric contact 242 being in contact with a peripheral edge of the substrate W and an electric terminal 243 disposed in the substrate holder 30. The rectifier 270 is configured to supply a plating current between the anode 221 connected to the positive terminal 271 and the substrate W connected to the negative terminal 272, and measure an applied voltage between the positive terminal 271 and the negative terminal 272.

Also, the rectifier 270 is connected to a controller 260 for controlling an operation of the rectifier 270, and the controller 260 is connected to a computer 265. The computer 265 provides a user interface for an operator of the plating apparatus 10. The operator of the plating apparatus 10 can input various types of setting information concerning the plating processing via the computer 265. The setting information includes, for example, a set value of the plating current to be outputted by the rectifier 270. The controller 260 operates the rectifier 270 in accordance with the set value of the plating current inputted from the operator. The controller 260 also provides the computer 265 with status information based on information of a voltage measured in the rectifier 270. The operator of the plating apparatus 10 can receive this status information via the computer 265. The controller 260 may be configured to control operations of respective parts other than the rectifier 270 in the plating module 110 or respective units other than the plating module 110 in the plating apparatus 10, and provide the computer 265 with various types of status information concerning these operations.

The anode holder 220 holding the anode 221 and the substrate holder 30 holding the substrate W are immersed into the plating solution Q in the plating device 114, and arranged such that the anode 221 and a plated surface W1 of the substrate W face each other substantially in parallel with each other. The anode 221 and the substrate W, which are immersed into the plating solution Q in the plating device 114, receive the plating current supplied from the rectifier 270. Consequently, metal ions in the plating solution Q are reduced in the plated surface W1 of the substrate W, to form a film on the plated surface W1.

The anode holder 220 includes an anode mask 225 for adjusting an electric field between the anode 221 and the substrate W. The anode mask 225 is a substantially plate-shaped member made of, for example, a dielectric material, and is disposed on a front surface (surface on a side that faces the substrate holder 30) of the anode holder 220. Specifically, the anode mask 225 is disposed between the anode 221 and the substrate holder 30. The anode mask 225 includes, substantially in a center, a first opening 225a through which the current flowing between the anode 221 and the substrate W passes. It is preferable that a diameter of the opening 225a is smaller than a diameter of the anode 221. The anode mask 225 may be configured such that the diameter of the opening 225a is adjustable.

The plating module 110 further includes a regulation plate 230 for adjusting the electric field between the anode 221 and the substrate W. The regulation plate 230 is a substantially plate-shaped member made of, for example, a dielectric material, and is disposed between the anode mask 225 and the substrate holder 30 (substrate W). The regulation plate 230 includes a second opening 230a through which the current flowing between the anode 221 and the substrate W passes. It is preferable that a diameter of the opening 230a is smaller than a diameter of the substrate W. The regulation plate 230 may be configured such that the diameter of the opening 230a is adjustable. Furthermore, a paddle (not shown) as a stirring rod with which the plating solution Q in the plating device 114 is stirred is disposed between the regulation plate 230 and the substrate holder 30 (substrate W).

The plating device 114 includes a plating solution supply port 256 for supplying the plating solution Q into the device. The overflow tank 136 includes a plating solution discharge port 257 for discharging the plating solution Q overflowed from the plating device 114. The plating solution supply port 256 is disposed in a bottom of the plating device 114, and the plating solution discharge port 257 is disposed in a bottom of the overflow tank 136.

When the plating solution Q is supplied from the plating solution supply port 256 to the plating device 114, the plating solution Q overflows from the plating device 114, and flows over the partition wall 255 into the overflow tank 136. The plating solution Q flowing into the overflow tank 136 is discharged from the plating solution discharge port 257, and has impurities removed with a filter or the like included in a plating solution circulation device 258. The plating solution Q from which the impurities are removed is supplied through the plating solution supply port 256 to the plating device 114 by the plating solution circulation device 258.

Figure 3:
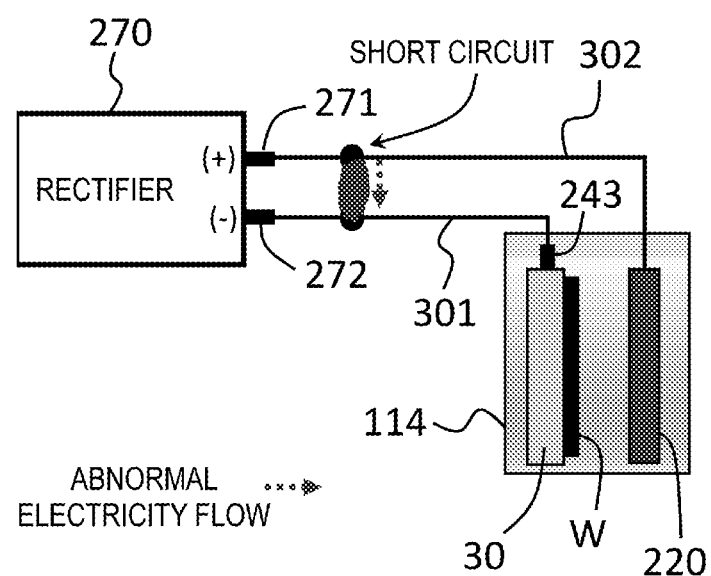
FIG. 3 is a diagram showing a situation where a short circuit occurs in an electric wiring connecting a rectifier to an anode holder and a substrate holder.

FIG. 3 shows a situation where a short circuit occurs in an electric wiring connecting the rectifier 270 to the anode holder 220 and the substrate holder 30. As described above, the substrate W and the substrate holder 30 holding the substrate W are transferred by the second transfer device 144 (see FIG. 1), and stored in the plating device 114. More specifically, the electric terminal 243 of the substrate holder 30 is connected to a cathode side electric wiring 301 of the rectifier 270, and the substrate W and the substrate holder 30 holding the substrate W are immersed into the plating solution Q with which the plating device 114 is filled.

If a short circuit does not occur between the cathode side electric wiring 301 and an anode side electric wiring 302, and when the plating current is supplied from the rectifier 270 to the substrate W immersed into the plating solution Q, an output voltage between the positive terminal 271 and the negative terminal 272 of the rectifier 270 indicates a normal value (i.e., a voltage value determined depending on the plating current supplied to the substrate W and a load resistance between the substrate W and the anode 221). On the other hand, if a short circuit occurs between the cathode side electric wiring 301 and the anode side electric wiring 302, the load resistance turns substantially to zero, and the output voltage between the positive terminal 271 and the negative terminal 272 of the rectifier 270 when the plating current flows accordingly noticeably drops from the normal value. If this voltage change (or change in load resistance) is detected, the occurrence of a short circuit can be identified. However, the substrate W is once immersed into the plating solution Q. or the supply of the plating current to the substrate W is already started (presence of a short circuit is then found) and formation of a plating film on the substrate W partially proceeds. Therefore, the substrate has a problem in quality control, and needs to be discarded as a defective product.

Figure 4A:
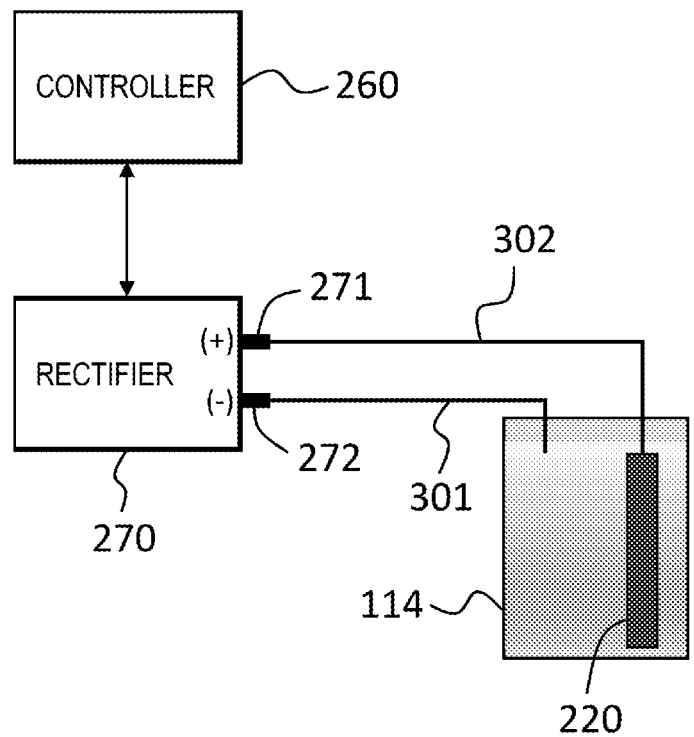
FIG. 4A is a diagram showing a short circuit detection method according to the embodiment of the present invention.
Figure 4B:
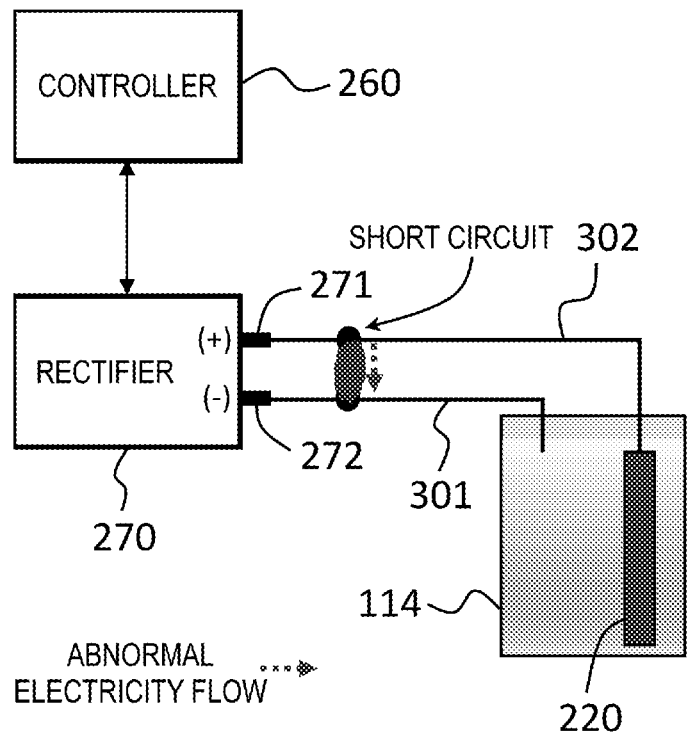
FIG. 4B is a diagram showing the short circuit detection method according to the embodiment of the present invention.

FIGS. 4A and 4B are diagrams showing a short circuit detection method according to the embodiment of the present invention. FIG. 4A shows a normal state where a short circuit has not occurred yet between the cathode side electric wiring 301 and the anode side electric wiring 302, and FIG. 4B shows a state where a short circuit has occurred between the cathode side electric wiring 301 and the anode side electric wiring 302. As shown in FIGS. 4A and 4B, the rectifier 270 is not connected to the substrate W and the substrate holder 30 holding the substrate W. Specifically, the short circuit detection method according to the present embodiment is performed before the substrate W and the substrate holder 30 holding the substrate W are stored in the plating device 114.

The rectifier 270 outputs a current with a predetermined current value for short circuit detection. However, the substrate W and the substrate holder 30 are not connected to the cathode side electric wiring 301 of the rectifier 270, and hence in the normal state (non-short circuit time) of FIG. 4A, a circuit between the cathode side electric wiring 301 and the anode side electric wiring 302 is open. Therefore, at normal time of FIG. 4A, a current does not actually flow through this circuit, and a voltage applied between the positive terminal 271 and the negative terminal 272 of the rectifier 270 is a high voltage. On the other hand, in the short circuit state of FIG. 4B, the output current from the rectifier 270 flows through a short circuit path between the cathode side electric wiring 301 and the anode side electric wiring 302, and hence the output voltage between the positive terminal 271 and the negative terminal 272 of the rectifier 270 indicates a voltage value smaller than that in the normal state (non-short circuit time) of FIG. 4A.

The controller 260 acquires, from the rectifier 270, an output voltage value between the positive terminal 271 and the negative terminal 272, and compares the value with a predetermined reference voltage value. The controller 260 determines that a short circuit occurs between the cathode side electric wiring 301 and the anode side electric wiring 302, in a case where the output voltage value between the positive terminal 271 and the negative terminal 272 of the rectifier 270 is lower than the predetermined reference voltage value, and the controller determines that a short circuit does not occur, in a case where the output voltage value is higher than the reference voltage value.

Thus, according to the short circuit detection method of the present embodiment, a short circuit between the cathode side electric wiring 301 and the anode side electric wiring 302 can be detected in a state where the rectifier 270 is not connected to the substrate W and the substrate holder 30, that is, before the substrate W and the substrate holder 30 are stored in the plating device 114 to start the plating processing. Therefore, the method of the present embodiment has an advantage that the substrate W does not have to be used in vain for short circuit detection.

In addition, it is preferable that a magnitude of the current to be outputted by the rectifier 270 for the short circuit detection is smaller than a magnitude of the plating current to be outputted when performing plating processing on the substrate W. Consequently, a short circuit can be detected without electrically adversely affecting a circuit (the rectifier 270, the electric wirings 301 and 302, the anode 221 and the like).

Figure 5:
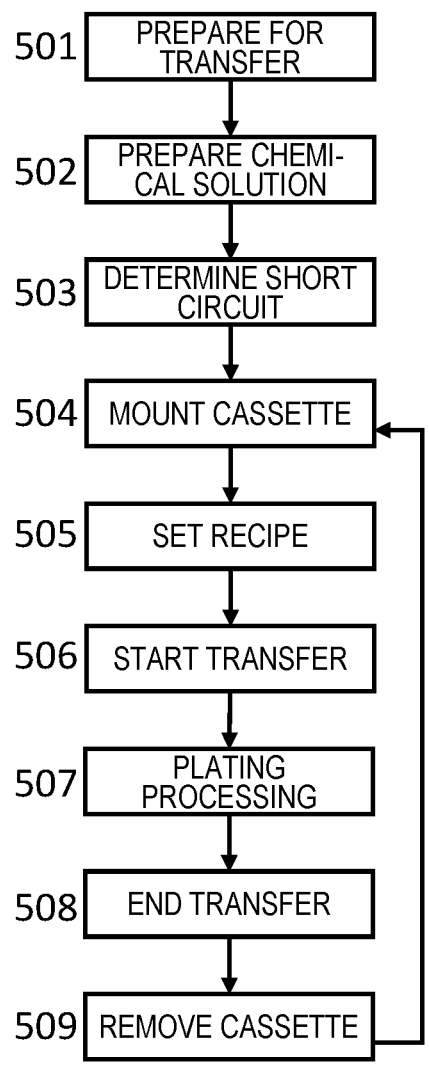
FIG. 5 is a flowchart showing an overall flow of plating processing in the plating apparatus of the present embodiment.

FIG. 5 is a flowchart showing an overall flow of plating processing in the plating apparatus 10 of the present embodiment. First, the transfer device 140 and the transfer robot 122 prepare for operations (step 501), and the plating solution Q is prepared in the plating device 114 of the plating module 110 (step 502). After completing the preparation of the plating solution Q, short circuit detection according to the present embodiment is performed in step 503 (details will be described later with reference to FIG. 6). Furthermore, the cassette 100 containing the substrate is mounted to each cassette table 102 (step 504).

Next, the operator sets recipe of the plating processing via the user interface of the computer 265 (step 505). When the recipe is set and a start instruction of the plating processing is given, the transfer device 140 and the transfer robot 122 start transfer (step 506), the substrate W and the substrate holder 30 are transferred to the plating module 110, and the plating current is supplied from the rectifier 270 to the substrate W to perform the plating processing on the substrate W (step 507).

When the plating processing is finished, the plated substrate W is returned to the cassette 100 by the transfer device 140 and the transfer robot 122 (step 508), and the cassette 100 containing the plated substrate is removed from the cassette table 102 (step 509). Afterward, the processing returns to the step 504 to mount the cassette 100 containing the unprocessed substrate to the cassette table 102, and the same operation is repeated.

Figure 6:
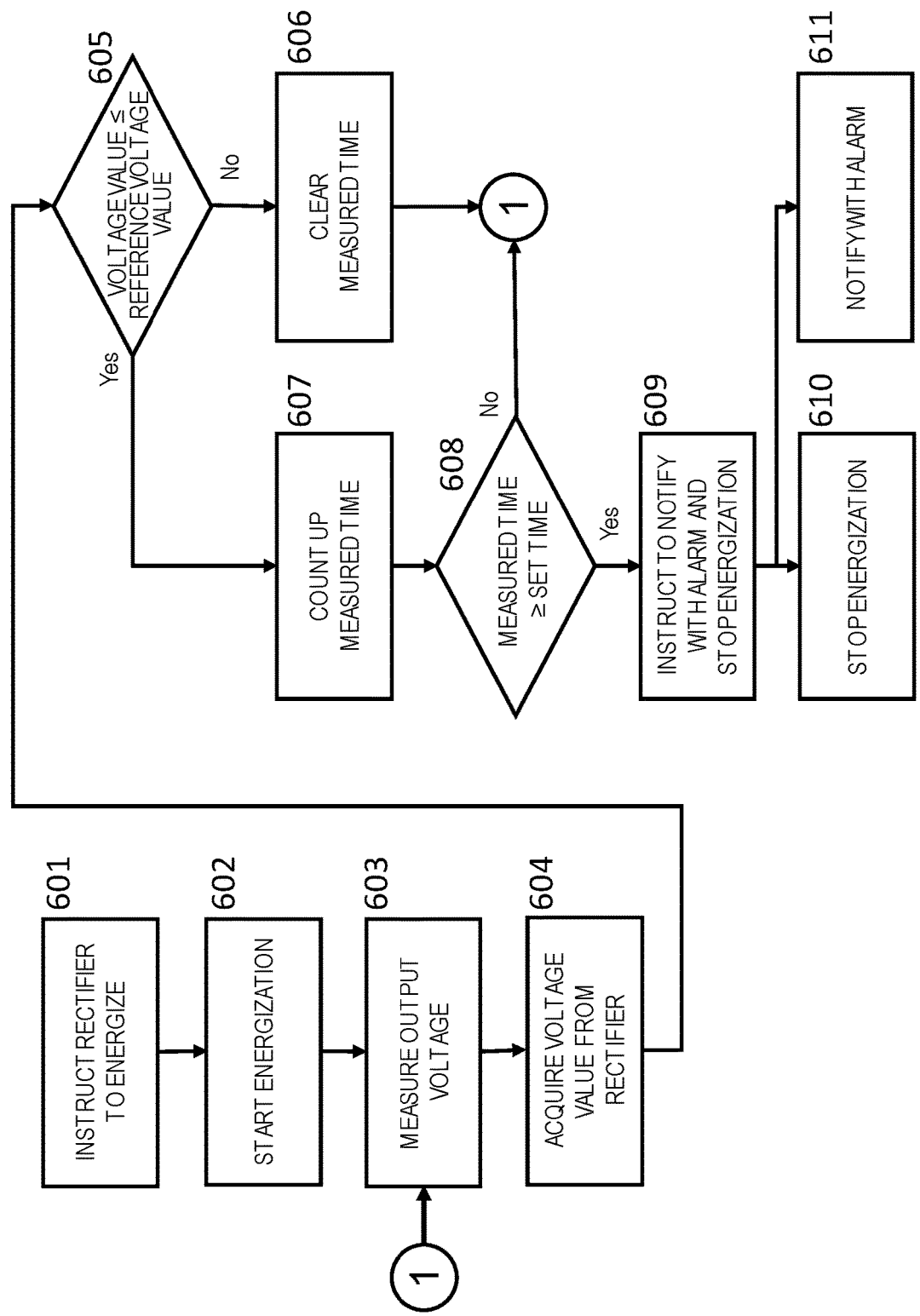
FIG. 6 is a flowchart showing the short circuit detection method according to the embodiment of the present invention.

FIG. 6 is a flowchart showing the short circuit detection method according to the embodiment of the present invention, and shows the details of the step 503 of the flowchart of FIG. 5.

First, the controller 260 instructs the rectifier 270 to energize with a predetermined set current value (step 601). The predetermined set current value indicates a current value of the current outputted from the rectifier 270 for the short circuit detection, and may be, for example, a value smaller than a value of the plating current outputted from the rectifier 270 for the plating processing (current outputted in the step 507 of FIG. 5).

The rectifier 270 starts the energization with the instructed current value (step 602), and measures the output voltage between the positive terminal 271 and the negative terminal 272 to transmit the measured value to the controller 260 (step 603).

The controller 260 acquires the measured value of the output voltage from the rectifier 270 (step 604), and compares the voltage value with a predetermined reference voltage value (step 605). The predetermined reference voltage value may be an appropriate voltage value set beforehand to appropriately distinguish between a case where there is no short circuit in the circuit (FIG. 4A) and a case where there is a short circuit (FIG. 4B).

In a case where the measured output voltage value of the rectifier 270 is larger than the reference voltage value, the controller 260 clears a measured time of a timer (step 606), and then repeats the step 603 and the subsequent steps.

In a case where the measured output voltage value of the rectifier 270 is smaller than the reference voltage value, the controller 260 counts up the measured time of the timer (step 607), and determines whether or not the measured time is in excess of a predetermined set time (e.g., from several seconds to about ten seconds) (step 608).

If the measured time is in excess of the set time, the controller 260 determines that a short circuit occurs between the cathode side electric wiring 301 and the anode side electric wiring 302 of the plating module 110, and instructs the computer 265 and the rectifier 270 to notify with an alarm and stop the energization, respectively (step 609). The rectifier 270 stops the energization for the short circuit detection (step 610), and the computer 265 notifies the operator of the plating apparatus 10 with the alarm (a character, image, sound or the like) indicating that the short circuit occurs, via the user interface (step 611).

Thus, in a case where it is detected that a short circuit occurs between the cathode side electric wiring 301 and the anode side electric wiring 302 of the plating module 110, execution of the step 504 and the subsequent steps of FIG. 5 may be prohibited. On the other hand, in a case where it is determined that no short circuit occurs, the step 504 and the subsequent steps of FIG. 5 are executed. Specifically, the substrate W and the substrate holder 30 are connected to the rectifier 270, and the plating current is supplied from the rectifier 270 to the substrate W to perform the plating processing on the substrate W. Thus, according to the short circuit detection method of the present embodiment, the short circuit can be detected before the plating processing of the substrate W is started, and use of the substrate W in vain for the short circuit detection can be avoided.

The embodiment of the present invention has been described above based on several examples, but the above embodiment of the present invention is described to facilitate understanding of the invention, and does not limit the present invention. The present invention may be changed or modified without departing from the scope, and needless to say, the present invention includes equivalents to the invention. Also, any combination or omission of the respective constituent elements described in claims and specification is possible in a range in which at least some of the above described problems can be solved or a range in which at least some of effects are exhibited.

REFERENCE SIGNS LIST

10 plating apparatus
30 substrate holder
100 cassette
102 cassette table
104 aligner
106 spin rinse dryer
110 plating module
114 plating device
120 load/unload station
122 transfer robot
124 stocker
126 pre-wet module
128 pre-soak module
130*a* first rinse module
130*b* second rinse module
132 blow module
136 overflow tank
140 transfer device
142 first transfer device
144 second transfer device
150 rail
152 mounting plate
160 paddle drive part
162 paddle driven part
220 anode holder
221 anode
223 electric terminal
225 anode mask
225*a* first opening
230 regulation plate
230*a* second opening
242 electric contact
243 electric terminal
255 partition wall
256 plating solution supply port
257 plating solution discharge port
258 plating solution circulation device
260 controller
265 computer
270 rectifier
271 positive terminal
272 negative terminal
301 cathode side electric wiring
302 anode side electric wiring
Q plating solution
W substrate
W p plated surface

What is claimed is:

1. A control method for use in a plating apparatus that supplies a current from a rectifier to a substrate to plate the substrate, the method comprising:
   a step of outputting a current with a first current value from the rectifier, in a state where the substrate and a substrate holder holding the substrate are not electrically connected to the rectifier;
   a step of acquiring an output voltage value of the rectifier;
   a step of comparing the output voltage value with a predetermined reference voltage value;
   a step of determining whether a short circuit does not occur in a circuit for connecting the rectifier and the substrate, in a case where the output voltage value is higher than the reference voltage value;
   a step of determining whether the short circuit occurs in the circuit for connecting the rectifier and the substrate, in a case where the output voltage value is lower than the reference voltage value; and
   a step of electrically connecting the substrate and the substrate holder holding the substrate to the rectifier and performing plating processing of the substrate in response to determining that the short circuit does not occur in the circuit for connecting the rectifier and the substrate, wherein the plating processing of the substrate is performed by outputting a current with a second current value from the rectifier, wherein the first current value is smaller than the second current value.

2. A control method of a plating apparatus that supplies a current from a rectifier to a substrate to plate the substrate, the control method of the plating apparatus comprising:
   a step of outputting, from the rectifier, a current with a first current value, in a state where the substrate and a substrate holder holding the substrate are not electrically connected to the rectifier;
   a step of acquiring an output voltage value of the rectifier;
   a step of comparing the output voltage value with a predetermined reference voltage value;

a step of determining that a short circuit does not occur in a circuit for connecting the rectifier and the substrate, in a case where the output voltage value is higher than the reference voltage value;

a step of determining that the short circuit occurs in the circuit for connecting the rectifier and the substrate, in a case where the output voltage value is lower than the reference voltage value;

a step of electrically connecting the substrate and the substrate holder holding the substrate to the rectifier, and performing plating processing of the substrate, in response to the determination that the short circuit does not occur in the circuit for connecting the rectifier and the substrate, wherein the plating processing of the substrate is performed by outputting a current with a second current value from the rectifier, and wherein the first current value is smaller than the second current value; and a step of prohibiting the plating processing of the substrate, in response to the determination that the short circuit occurs in the circuit for connecting the rectifier and the substrate.

3. A plating apparatus comprising:

a plating device for plating a substrate;

a rectifier for supplying a current to the substrate; and a control unit, the control unit being configured to cause the rectifier to output a current with a first current value, in a state where the substrate and a substrate holder holding the substrate are not electrically connected to the rectifier, acquire an output voltage value of the rectifier, compare the output voltage value with a predetermined reference voltage value, and determine that a short circuit occurs in a circuit for connecting the rectifier and the substrate, in a case where the output voltage value is lower than the reference voltage value, wherein the rectifier is configured to output a current with a second current value to plate the substrate, wherein the first current value is smaller than the second current value.

\* \* \* \* \*